(12) United States Patent
Azuhata et al.

(10) Patent No.: US 7,619,479 B2
(45) Date of Patent: Nov. 17, 2009

(54) SEMICONDUCTOR INTEGRATED CIRCUIT

(75) Inventors: Satoshi Azuhata, Osaka (JP); Makoto Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 17 days.

(21) Appl. No.: 12/055,714

(22) Filed: Mar. 26, 2008

(65) Prior Publication Data
US 2008/0290950 A1 Nov. 27, 2008

(30) Foreign Application Priority Data
Mar. 26, 2007 (JP) .............................. 2007-079613

(51) Int. Cl.
*H03F 3/04* (2006.01)
(52) U.S. Cl. ...................... 330/297; 330/307
(58) Field of Classification Search ............... 330/297, 330/307, 252, 298, 207 P
See application file for complete search history.

(56) References Cited

U.S. PATENT DOCUMENTS 5,289,137 A    2/1994  Nodar et al.
5,686,860 A *  11/1997 Matyas .................... 327/540
6,922,099 B2 * 7/2005  Shor et al. ................ 327/543
7,378,904 B2 * 5/2008  Risbo ....................... 330/10
7,414,890 B2 * 8/2008  Byeon et al. ........... 365/185.18

FOREIGN PATENT DOCUMENTS
JP          2000-040385 A    2/2000

* cited by examiner

*Primary Examiner*—Henry K Choe
(74) *Attorney, Agent, or Firm*—Hamre, Schumann, Mueller & Larson, P.C.

(57) ABSTRACT

The semiconductor integrated circuit includes a constant voltage regulator 3 generating a predetermined constant voltage from an external power supply 16, an inverting charge pump circuit 2 using the output of the constant voltage regulator as its power supply, and an amplifier circuit 4 using the negative voltage outputted by the charge pump circuit as a reference voltage. The output voltage of the constant voltage regulator is set so that a potential difference between the output voltage of the constant voltage regulator and the output voltage of the charge pump circuit is not to exceed a withstand voltage of the amplifier circuit, and power is supplied to the constant voltage regulator and amplifier circuit from a single external power supply. Even if the voltage of the external power supply increases, the negative voltage output of the charge pump circuit does not change, permitting an increase in the maximum value of the external power supply voltage with account taken of the withstand voltage.

3 Claims, 4 Drawing Sheets

SEMICONDUCTOR INTEGRATED CIRCUIT

BACKGROUND OF THE INVENTION

1. Field of the Invention

The present invention relates to a semiconductor integrated circuit having a DC-DC converter of a charge pump circuit type and configured so as to use its output as a reference voltage for an amplifier circuit.

2. Description of Related Art

Headphone amplifiers, video drivers, and other semiconductor circuits conventionally have required a ground potential to be used as the bias voltage of output signals, but since the ground potential was used as the reference potential of the circuits, the bias voltage of the output signals was positive. Accordingly, a bias voltage had to be converted to a ground potential by connecting a decoupling capacitor between the output and the load. However, some semiconductor circuits that have become popular in recent years have a negative power supply built into the semiconductor circuits to make the reference voltage negative, thereby permitting use of the bias voltage of the output signals as the ground potential without conversion. In such semiconductor circuits, an inverting charge pump circuit is used as a means for generating a negative power supply.

An example of such a semiconductor circuit with a built-in negative power supply has been disclosed, for instance, in the specification of U.S. Pat. No. 5,289,137. Below, the semiconductor circuit disclosed in the specification of U.S. Pat. No. 5,289,137 will be explained with reference to FIG. 3.

In FIG. 3, reference numeral 21 designates a semiconductor chip, which has an inverting charge pump circuit 22 and an amplifier circuit 23 built into it. A power-supply voltage (VCC) is supplied from an external power supply 24 to the semiconductor chip 21, and a flying capacitor 25 and output capacitor 26 are connected to the charge pump circuit 22.

The inverting charge pump circuit 22 uses the external power supply 24 as its power supply and outputs a negative voltage obtained by inverting the power-supply voltage (VCC) obtained from the external power supply 24 to a charge pump output terminal 27. At such time, the absolute value of the charge pump negative output voltage reaches a value (−VCC) nearly equal to the power-supply voltage obtained from the external power supply 24. In operation, the amplifier circuit 23 uses the charge pump negative output voltage (−VCC) as a reference voltage and external power supply 24 as its power supply.

Input signals to the amplifier circuit 23 are inputted via a signal input terminal 28 and output signals from the amplifier circuit 23 are outputted via a signal output terminal 29.

The incorporation of the negative power supply circuit in the semiconductor with a single power supply is made possible by sharing the power supplied by the external power supply 24 between the charge pump circuit 22 and amplifier circuit 23.

However, the problem with the circuit disclosed in the specification of U.S. Pat. No. 5,289,137 is that the maximum value of the voltage of the external power supply 24 has to be limited so as not to exceed the withstand voltage of the charge pump circuit 22 and amplifier circuit 23.

Considering the convenience of assembly in using the semiconductor chip 21, it is undesirable to limit the maximum value of the voltage of the external power supply 24. Although such a problem does not occur if the circuit is composed of elements possessing high withstand voltages, it becomes important to address this problem when using CMOS circuits, which are superior in terms of cost and power savings.

This problem is explained below with reference to FIG. 3. In FIG. 3, the negative output voltage of the charge pump circuit 22 changes in concert with the external power supply 24, such that when the external power supply voltage is +VCC, the charge pump negative output voltage becomes practically equal to −VCC. Therefore, if the voltage of the external power supply 24 increases by ΔVCC, the voltage on the charge pump circuit 22 and amplifier circuit 23 will increase by 2×ΔVCC.

A withstand voltage of the amplifier circuit 23 is limited by a withstand voltage of the MOS transistors composing an inverter 30 of an output stage thereof. When designating this withstand voltage as Vr, the acceptable ΔVCC will be:

$$\Delta VCC < (Vr - VCC)/2.$$

Thus, in comparison with an amplifier using a ground potential as the reference potential, an amplifier using a negative output voltage supplied by a charge pump circuit as a reference voltage has to suppress the amount of increase in the external power supply voltage relative to the usual value.

In addition, if ripples are generated in the external power supply 24, ripples with a 180° phase shift and identical magnitudes as shown in FIG. 4 are superimposed on the negative voltage output of the charge pump circuit 22. For this reason, larger ripples are generated in the output signal of the amplifier circuit 23 driven by those positive and negative voltage, in comparison with amplifiers using the ground potential as the reference potential.

SUMMARY OF THE INVENTION

Taking into account the above-described problems, it is an object of the present invention to provide a semiconductor circuit, wherein the maximum value of the external power supply voltage is not limited to a low value even when using a configuration utilizing a single external power supply and having a built-in inverting charge pump circuit. Moreover, it is another object of the present invention to decrease effects generated in the output signal when ripples are generated in the external power supply.

In order to solve the above-described problems, the semiconductor integrated circuit of the present invention includes a constant voltage regulator generating a predetermined constant voltage from an external power supply, an inverting charge pump circuit using an output of the constant voltage regulator as its power supply, and an amplifier circuit using the negative voltage outputted by the charge pump circuit as a reference voltage. The output voltage of the constant voltage regulator is set so that a potential difference between the output voltage of the constant voltage regulator and the output voltage of the charge pump circuit is not to exceed a withstand voltage of the amplifier circuit, and power is supplied to the constant voltage regulator and the amplifier circuit from a single external power supply.

In the charge pump circuit of the above-described configuration, the output voltage of the constant voltage regulator does not change even if there is an increase in the voltage of the single external power supply supplied to the semiconductor circuit, as a result of which the power supply voltage supplied to the charge pump circuit does not change and changes in the negative voltage output of the charge pump circuit can be prevented. Accordingly, even if the external power supply voltage increases, the voltage on the charge pump circuit always remains constant and it is possible to keep the amount of increase in the voltage on the amplifier circuit down to just the amount of increase in the external power supply voltage, thereby permitting an increase in the maximum value of the external power supply voltage while accounting for the withstand voltage.

Furthermore, even if ripples are generated in the external power supply, the ripples generated in the regulator output can be attenuated significantly in accordance with a ratio of removing variations of supply voltage in the constant voltage regulator, thereby reducing ripples generated in the charge pump output. As a result, the ripples in the output of the amplifier circuit driven with those positive and negative voltage can reduced.

A configuration can be used in which the constant voltage regulator comprises an operational amplifier constituting a non-inverting amplifier and a bandgap constant voltage source supplying a reference voltage to the operational amplifier, and the voltage of the constant voltage regulator is outputted upon amplification by the operational amplifier.

The output stage of the amplifier circuit may be constituted by an inverter composed of MOS transistors.

DETAILED DESCRIPTION OF THE INVENTION

Figure 1:
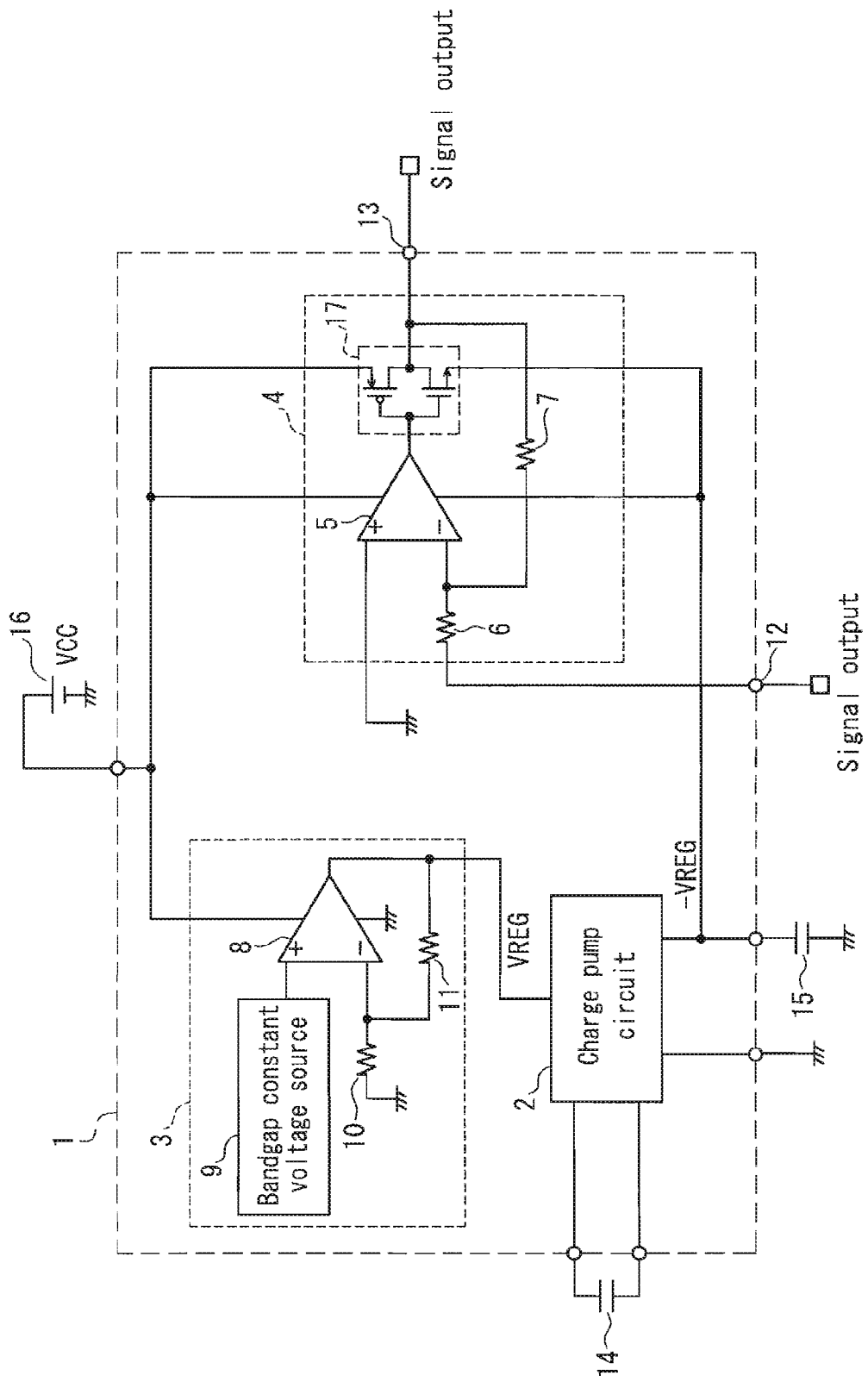
FIG. 1 is a block diagram illustrating a semiconductor integrated circuit according to an embodiment of the present invention.

A semiconductor integrated circuit according to an embodiment of the present invention will be described below with reference to the drawings. FIG. 1 is a block diagram illustrating a semiconductor integrated circuit according to an embodiment of the present invention.

In FIG. 1, reference numeral 1 designates a semiconductor chip, which has a charge pump circuit 2, a constant voltage regulator circuit 3, and an amplifier circuit 4 that amplifies signals. The amplifier circuit 4 includes an operational amplifier 5, resistors 6, 7 and an inverter 17 including MOS transistor composing an output stage. The regulator circuit 3 includes an operational amplifier 8, a bandgap constant voltage source 9, and resistors 10, 11. Input signals to the amplifier circuit 4 are inputted via a signal input terminal 12 and output signals from the amplifier circuit 4 are outputted via a signal output terminal 13.

The charge pump circuit 2 has a flying capacitor 14 and output capacitor 15, which are connected externally to the semiconductor chip 1. Furthermore, a power supply voltage is supplied to the operational amplifiers 5, 8 from an external power supply 16. The output of the regulator circuit 3 is supplied as a power supply for the charge pump circuit 2. Moreover, the output of the charge pump circuit 2 is supplied as a reference voltage for the amplifier circuit 4.

The regulator circuit 3, which has a non-inverting amplifier formed therein by the operational amplifier 8, outputs a voltage obtained by using the bandgap constant voltage source 9 as a reference voltage and amplifying it via the operational amplifier 8. The amplification factor is determined by the ratio of the resistors 10 and 11. Designating the bandgap voltage outputted by the bandgap constant voltage source 9 as VBG, the resistance values of the resistors 10, 11 respectively as R10 and R11, and the regulator output voltage outputted by the regulator circuit 3 as VREG, the following holds true:

$$VREG = VBG \times \{1 + (R11/R10)\}.$$

If the negative voltage required by the amplifier circuit 4 is −VSS, then the ratio of the resistors 10, 11 is set so that VREG=VSS. Since the output of the regulator circuit 3 is used as the power supply of the charge pump circuit 2, the current capability required for the output of the regulator circuit 3 is determined so as to enable supply of the maximum current flowing when the charge pump circuit 2 charges the flying capacitor 14. Since this current amount is quite large, it is necessary that the output transistor size of the operational amplifier 8 forming part of the regulator circuit 3 is sufficiently large. Furthermore, since the switching frequency of the charge pump circuit typically is in the range of from several hundred kHz to several MHz, it is necessary that the output has a sufficiently low impedance even when the regulator circuit 3 supplies current at a frequency in the range of from several hundred kHz to several MHz.

If the regulator circuit 3 is configured in the above-described manner, the bandgap constant voltage source 9 will have a constant value regardless of the voltage of the external power supply 16, and, as a result, the output voltage obtained by amplifying this voltage also will be a constant value. The negative output voltage of the charge pump circuit 2, which uses the regulator output as its power supply, is obtained by inversion of the regulator output voltage, and, if the regulator output is designated as VREG, the negative voltage generated by the charge pump circuit 2 will be −VREG, with its value also being a constant. At such time, the voltage on the charge pump circuit 2 will be $$VREG - (-VREG) = 2 \times VREG,$$

so as to be a value that will remain constant regardless of the voltage supplied by the external power supply 16. Therefore, as far as the charge pump circuit 2 is concerned, the value of the voltage of the external power supply 16 has no limitations so long as the regulator output voltage is set such that 2×VREG does not exceed the withstand voltage of the circuit.

Moreover, the amplifier circuit 4 constitutes an inverting amplifier, and the inverter 17 constituting an output stage amplifies input signals using the ground potential as a reference. A circuit is obtained in which the operational amplifier 5 uses the negative output voltage (−VREG) of the charge pump circuit 2 as a reference voltage, and, as a result, the bias voltage of the input signal can be set to 0V and amplification/output can be performed without converting the bias voltage.

If the resistance values of the resistors 6, 7 are designated as R6, R7 and the effective values of the input/output AC signals as Vin, Vout, then the output voltage of the amplifier circuit 4 will be:

$$Vout = (R7/R6) \times Vin.$$

Since the amplifier circuit 4 uses the external power supply 16 as its power supply, if the voltage of the external power supply 16 is designated as VCC, the voltage on the circuit will be:

$$VCC - VREG.$$

If the external power supply voltage increases by ΔVCC, the voltage on the amplifier circuit 4 also will increase by ΔVCC, while VREG does not change because the regulator output voltage is constant. Thus, when the external power supply voltage increases by ΔVCC, a change of the voltage supplied to the amplifier circuit is 2×ΔVCC in the conventional configuration, but is merely ΔVCC in the present embodiment. A withstand voltage of the amplifier circuit 4 is limited by a withstand voltage of the MOS transistors of the inverter 17 constituting the output stage, and the acceptable ΔVCC in the conventional circuit was given by ΔVCC<(Vr−VCC)/2, where Vr designates the withstand voltage of the circuit. On the other hand, in the configuration of the present invention, it is given by:

$$\Delta VCC < Vr - VCC,$$

which makes it possible to double the conventional acceptable ΔVCC. In this manner, in accordance with the present embodiment, it becomes possible to permit a greater range of fluctuation for the external power supply than in the prior art even in the case of semiconductor circuits having a built-in inverting charge pump circuit and a single external power supply.

Figure 3:
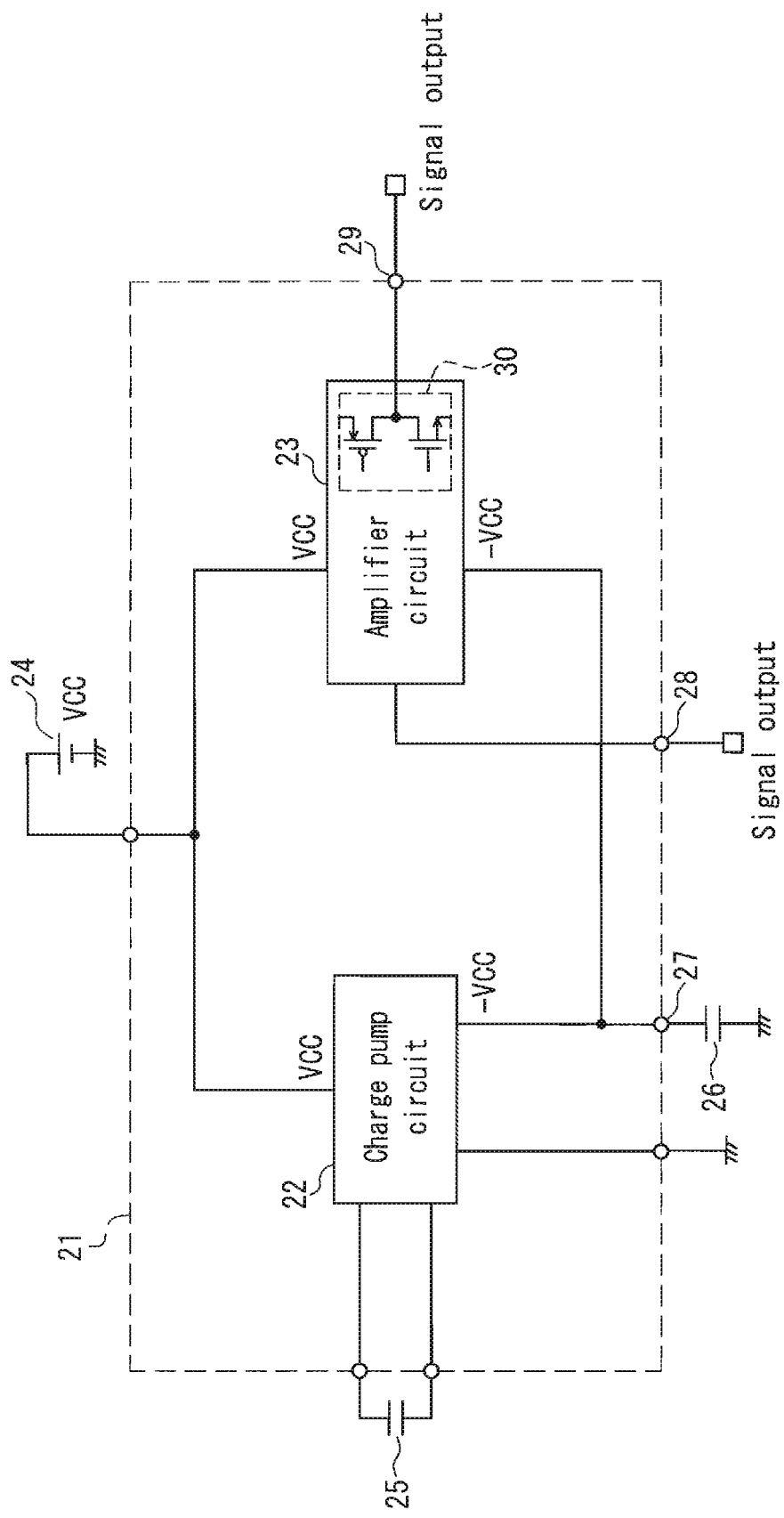
FIG. 3 is a block diagram illustrating an exemplary conventional semiconductor integrated circuit.
Figure 4:
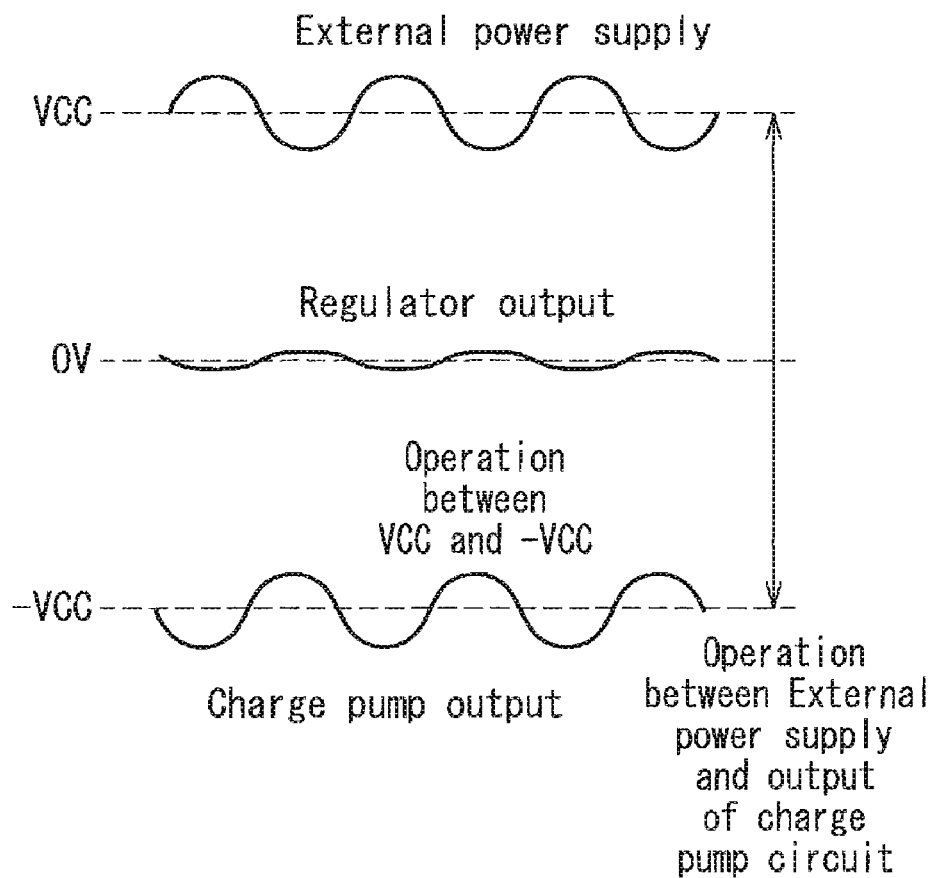
FIG. 4 shows waveforms in the respective parts of a charge pump circuit in the conventional semiconductor integrated circuit when ripples are generated in an external power supply.

Furthermore, in the conventional example of FIG. 3, when ripples were generated in the external power supply 24, as shown in FIG. 4, the ripples were subject to a 180° phase shift and were generated in the charge pump output at the same magnitude. For this reason, large ripples are superimposed in the output signal of the amplifier circuit 23, since it is affected by ripples from both of the positive and negative voltage for driving the amplifier circuit 23.

Figure 2:
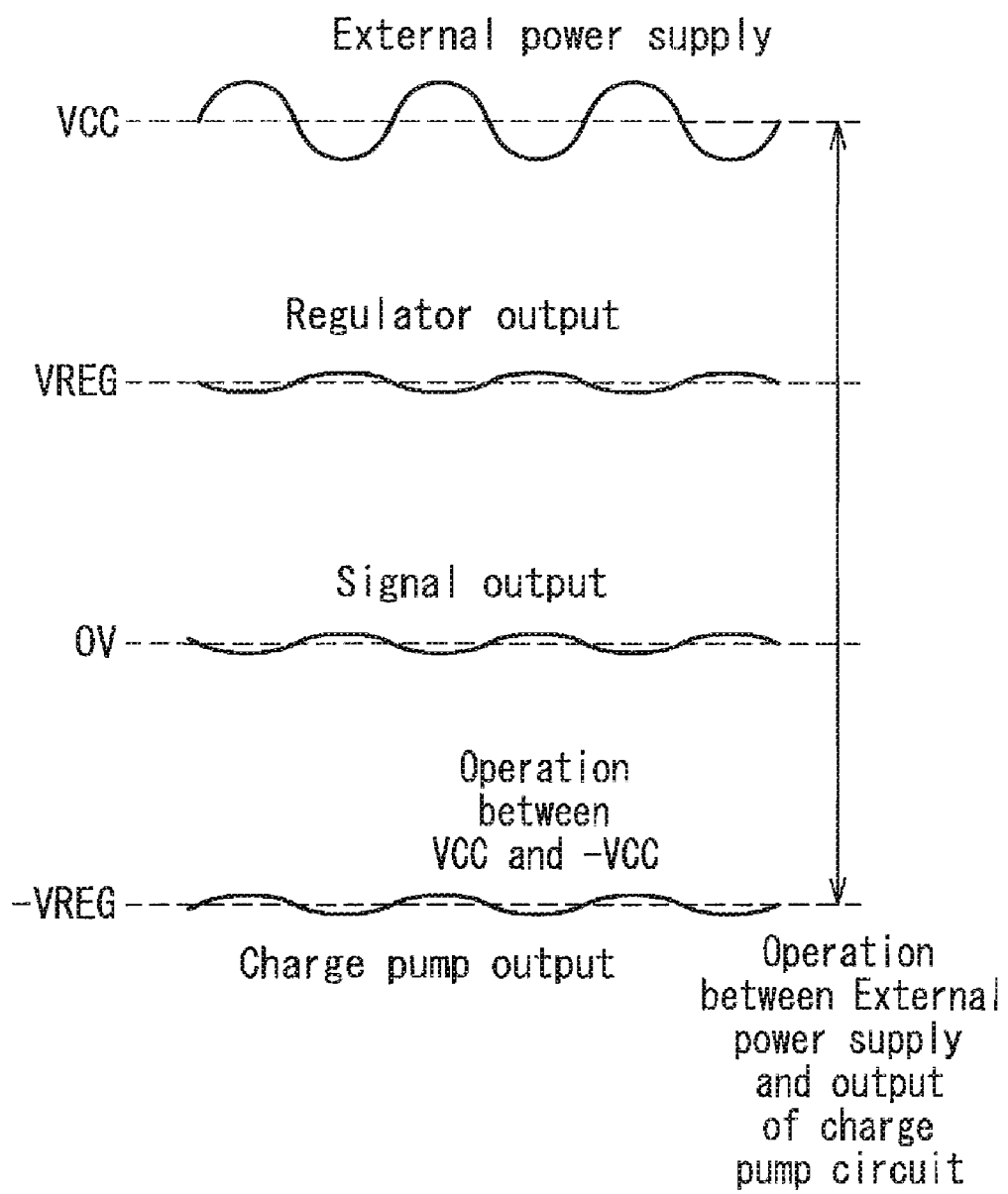
FIG. 2 shows waveforms in the respective parts of a charge pump circuit in the same semiconductor integrated circuit when ripples are generated in an external power supply.

On the contrary, in the present embodiment, even if ripples are generated in the external power supply 16 in FIG. 1, a ripple voltage superimposed on the regulator output voltage VREG can be reduced in accordance with a ratio of removing variations of supply voltage in the constant voltage regulator 3, as shown in FIG. 2. Therefore similarly reduced ripples are superimposed on the output of the charge pump circuit 2 using the regulator output as a supply voltage. As a result, the output signal is affected only by ripples originating from the external power supply 16 between the positive and negative voltage for driving the amplifier circuit 4, which is remarkably reduced in comparison with that in the conventional configuration.

As described above, according to the semiconductor integrated circuit of the present invention, the maximum value of the external power supply voltage is not limited to a low value by the withstand voltage of the circuit elements when there is a built-in charge pump circuit, and the present invention is thus useful for headphone amplifiers, video drivers, and the like.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor integrated circuit comprising:
   a constant voltage regulator generating a predetermined constant voltage from an external power supply,
   an inverting charge pump circuit using an output of the constant voltage regulator as its power supply, and
   an amplifier circuit using the negative voltage outputted by the charge pump circuit as a reference voltage,
   wherein the output voltage of the constant voltage regulator is set so that a potential difference between the output voltage of the constant voltage regulator and the output voltage of the charge pump circuit is not to exceed a withstand voltage of the charge pump circuit, and
   power is supplied to the constant voltage regulator and the amplifier circuit from a single external power supply.

2. The semiconductor integrated circuit according to claim 1,
   wherein the constant voltage regulator comprises an operational amplifier that constitutes a non-inverting amplifier and a bandgap constant voltage source that supplies a reference voltage to the operational amplifier, and the voltage of the constant voltage regulator is outputted upon amplification by the operational amplifier.

3. The semiconductor integrated circuit according to claim 1, the output stage of the amplifier circuit is constituted by an inverter composed of MOS transistors.

\* \* \* \* \*